United States Patent
Han et al.

(10) Patent No.: US 6,198,338 B1
(45) Date of Patent: Mar. 6, 2001

(54) METHOD OF CONSTRUCTING A FUSE FOR A SEMICONDUCTOR DEVICE AND CIRCUIT USING SAME

(75) Inventors: Eui-gyu Han, Kyungki-do; Eun-han Kim, Ansan; Young-gun Kim, Suwon, all of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/161,228

(22) Filed: Sep. 28, 1998

Related U.S. Application Data

(63) Continuation-in-part of application No. 08/663,708, filed on Jun. 14, 1996, now abandoned.

(30) Foreign Application Priority Data

Jun. 15, 1995 (KR) .................................................. 95-15919

(51) Int. Cl.[7] .................................................. H01H 37/76
(52) U.S. Cl. ............................................................ 327/525
(58) Field of Search ...................................... 327/525, 526

(56) References Cited

U.S. PATENT DOCUMENTS

| | | | |
|---|---|---|---|
| 4,686,384 | * | 8/1987 | Harvey et al. ..................... 307/202.1 |
| 5,387,823 | * | 2/1995 | Ashizawa ................................ 326/13 |
| 5,424,672 | * | 6/1995 | Cowles et al. ........................ 327/525 |
| 5,748,031 | * | 5/1998 | Best ...................................... 327/525 |

* cited by examiner

*Primary Examiner*—Jeffrey Zweizig
(74) *Attorney, Agent, or Firm*—Jones Volentine, L.L.C.

(57) ABSTRACT

A method for providing a fuse apparatus for a semiconductor device includes providing at least one fuse portion of the fuse apparatus with at least two fuses connected in series. A circuit, such as a redundancy decoder, is adapted to utilize a fuse apparatus including at least one fuse portion having a plurality of fuses connected in series. The fuse apparatus is preferably provided with polysilicon fuses which are cut using a laser beam cutting device. The fuse apparatus provides an increased probability of accurately cutting a fuse portion of a fuse means necessary to effect a proper repair of the circuit and to improve the semiconductor circuit operational reliability.

18 Claims, 2 Drawing Sheets

METHOD OF CONSTRUCTING A FUSE FOR A SEMICONDUCTOR DEVICE AND CIRCUIT USING SAME

CROSS-REFERENCE TO RELATED APPLICATIONS

This application is a Continuation-in-Part of U.S. application Ser. No. 08/663,708, filed on Jun. 14, 1996, now abandoned.

BACKGROUND OF THE INVENTION

The present invention relates to a method of constructing a fuse means for a semiconductor device and a circuit adapted to utilize the same.

A fuse means is widely used in a semiconductor device to restore a memory cell through repair, to adjust transistor dimensions, to provide a desired transmission delay for a signal, and to control the pulse-width of a signal.

One commonly-used type of fuse means comprises a one-piece fuse set. A problem with this fuse means is that when the fuse of the fuse means is imperfectly cut one cannot obtain the expected and desired circuit operation.

For example, a fuse means may be utilized as a means for repairing a circuit by replacing an impaired main cell with a redundancy cell in order to improve the production yield of a memory device. In such a case, replacement is usually performed by cutting a fuse of a redundancy decoder in accordance with the address of the main cell to be replaced by utilizing a laser beam cutting device.

FIG. 1 is a circuit diagram illustrating a portion of a redundancy decoder which is constructed by using a conventional fuse construction method. It illustrates the portion of the redundancy decoder comprising one master fuse portion $F_M$ and decoding fuse portions $F_D$'s with each of the decoding fuses corresponding to a row address.

In such a redundancy decoder it is generally necessary to perform repairs by cutting the master fuse $F_M$ and then selectively cutting a decoder fuse $F_D$ corresponding to the address of an impaired main cell. However, performing such repairs normally cannot be done very easily in such a manner as to avoid imperfect cutting of the fuses and subsequently impaired operation of the circuit.

A repair operation involving a master fuse portion is described in more detail as follows.

During a repair, when a signal $RCS_XB$ is maintained at a low level of potential and the master fuse is cut properly, the potential of a node N1 is raised to a high level. However, when master fuse $F_M$ is not completely cut, the master fuse will then serve as a resistance, thus turning off a PMOS transistor T2, which in turn decreases the potential of node N1 to a low level.

Similarly, incomplete cutting of decoding fuse $F_D$ has undesired consequences. Such improper repair attempts bring about current leakage through a ground which should be prevented in normal operation.

FIGS. 2A to 2C are photos illustrating the imperfect cut of a fuse having the construction of a conventional fuse means and the result of a structural analysis of the cut portion.

FIG. 2A is a photo showing the cut portion of a fuse, while FIG. 2B is a photo showing a magnification of the cut portion of the fuse shown in FIG. 2A. Each of FIGS. 2A and 2B indicate that the fuse is not completely cut through. FIG. 2C is a photo showing the result of the structural analysis of the fuse portions remaining as a result of the incomplete cutting attempt. FIG. 2C indicates that silicon, which is identical to that constructing the fuse, remains in the cut section of the fuse portion.

Imperfect cutting of a fuse also imposes constraints on use of the fuse for the adjustment of transistor dimensions, the transmission delay of a signal and the control of the pulse-width of a signal. In the case of a fuse fabricated for the transmission delay of a signal, for example, the imperfect cut of the fuse serves as a principal factor to deteriorate reliability of a semiconductor device. The phenomenon of speed-push, that is, causing less delay than is expected to happen, is one undesired consequence that frequently arises.

SUMMARY OF THE INVENTION

It is an object of this invention is to provide a method of constructing a fuse means for a semiconductor device which is adapted to permit an effective repair by cutting of a fuse contained within the fuse means.

It is another object to provide a method of constructing such a fuse means which may be repaired by cutting a fuse using a laser beam cutting device.

It is yet another object of the present invention to provide a method of constructing a fuse means in a semiconductor circuit wherein the method comprises the step of connecting a plurality of fuses in at least one series arrangement.

In a preferred method for constructing a fuse means, fuses are provided in pairs of two, if such is permitted by constraints imposed by the area that the fuse means comprising the arrangement of fuses will occupy.

It is a further object of the present invention to provide a semiconductor circuit comprising at least one fuse means wherein, the fuse means comprises a plurality of fuses which are connected in series.

It is a yet further object of the present invention to provide a semiconductor circuit wherein a fuse means is located in a redundancy circuit.

It is still another object of the invention to provide a circuit adapted to utilize a fuse means comprising a plurality of fuses.

Thus, it is an object of the present invention to provide such a circuit and to provide a repair method with an improved probability that a proper fuse cut is obtained. A further object of the invention is to provide a circuit with a fuse means adapted to comprise a plurality of fuses connected in series to yield such an improved probability of a proper repair. One further object is to provide a fuse means with a plurality of fuses which may each be cut using a laser beam cutting device.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

A fuse means construction method of the present invention is provided which increases the probability of properly cutting a portion of a fuse means by constructing said fuse means adapted to include a plurality of fuses, preferably two fuses connected in series, instead of providing only one fuse, as in a conventional method. Preferably, the master fuse portion of the fuse means is a set of two fuses connected in series and the decoder fuse portions connected to the master fuse means also are arranged in sets of two fuses connected in a series.

Figure 1:
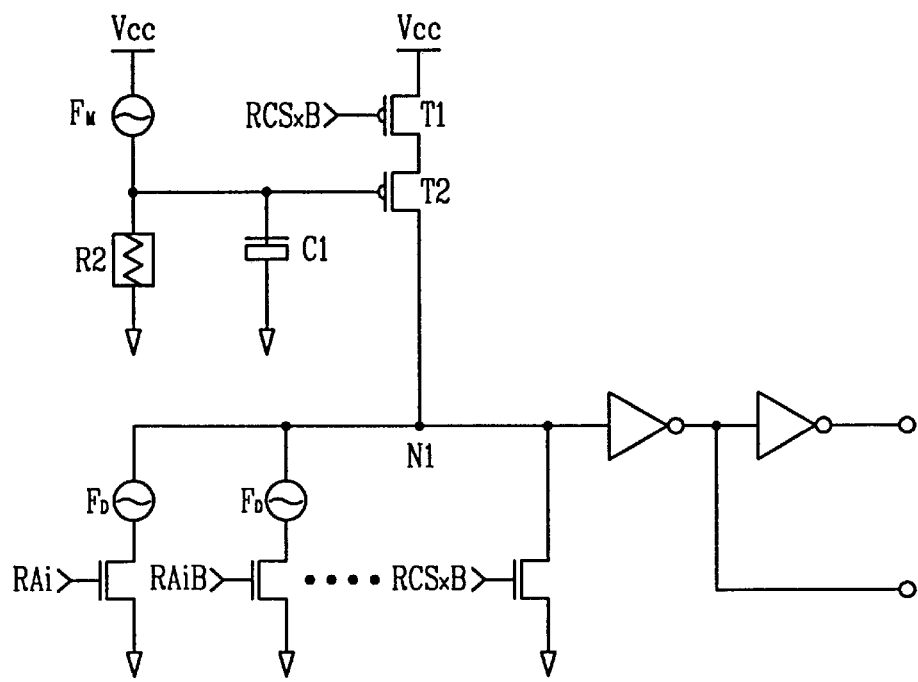
FIG. 1 is a circuit diagram illustrating a portion of a redundancy decoder constructed by utilizing a conventional construction method.
Figure 3:
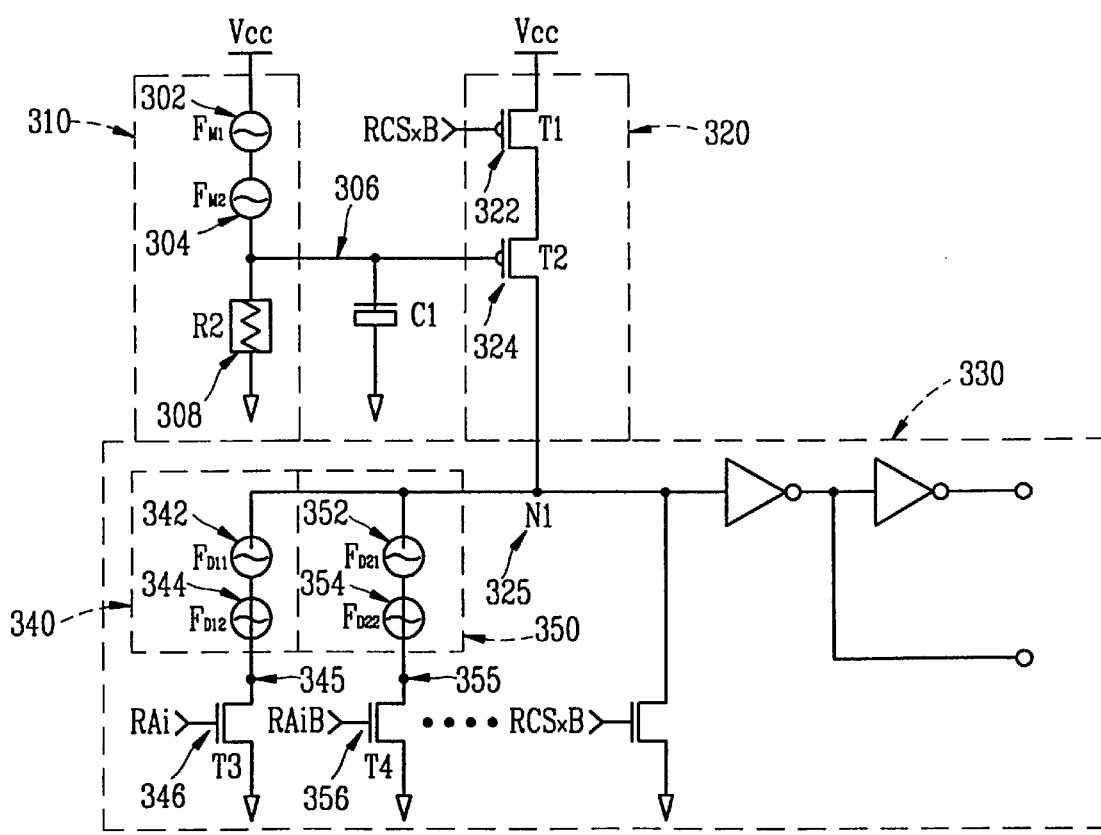
FIG. 3 is a circuit diagram of a portion of a redundancy decoder constructed by utilizing a fuse means construction method according to the present invention.
Figure 2A:
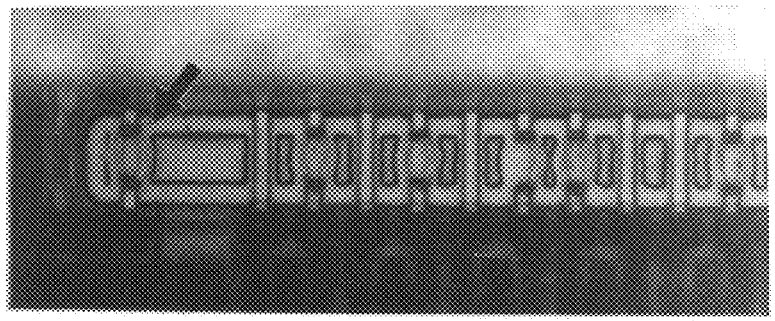
FIGS. 2A to 2C are photos illustrating an imperfect cut of a fuse arranged by the conventional fuse construction method and the results of a constituent analysis of the cut portion.
Figure 2B:
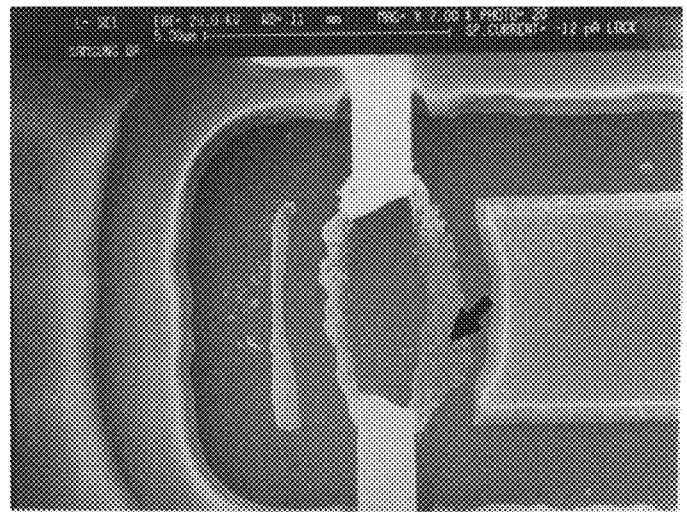
Figure 2C:
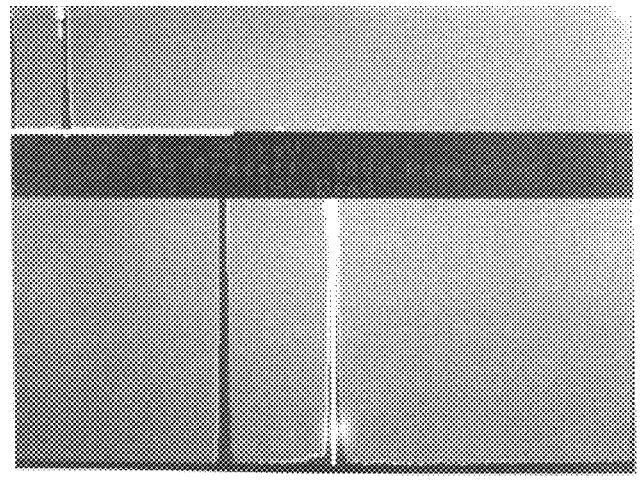

FIG. 3 is a circuit diagram showing a portion of a redundancy decoder constructed with the fuse construction method according to the present invention. In particular, a portion of a redundancy decoder of a semiconductor device is provided with a plurality of fuses, especially sets of two fuses connected in a series.

FIG. 3 shows a fuse means incorporated in a redundancy decoder in a semiconductor device, comprising precharge control section 310, precharging section 320 and programming section 330. The precharge control section 310 comprises master fuses $F_{M1}$ 302 and $F_{M2}$ 304 connected in series between a supply voltage $V_{CC}$ and a precharge control node 306. A high-resistance load precharge control resistor R2 308 is connected between the precharge control node 306 and ground. The precharge control section 310 produces a precharge control node voltage at the precharge control node 306.

The precharging section 320 comprises the PMOS transistors T1 322 and T2 324 connected in series between the supply voltage $V_{CC}$ and a summation node N1 325. When the precharge control node voltage is pulled to a high potential, such as the supply voltage $V_{CC}$, then the transistor T2 324 is turned off and the potential at the summation node N1 325 is kept low, regardless of the signal $RCS_XB$. During a repair, one or both of the master fuses $F_{M1}$ 302 and $F_{M2}$ 304 is cut and the precharge control node voltage is pulled low by the high-resistance load precharge control resistor R2 308, turning on the transistor T2 324. Thus when the signal $RCS_XB$ is maintained at a low level of potential and the master fuse is cut properly, the potential of a node N1 is raised to a high level.

The programming section 330 comprises first and second decoder fuse portions 340 and 350 connected between the summation node N1 325 and ground. The first decoder fuse portion 340 further comprises decoder fuses $F_{D11}$ 342 and $F_{D12}$ 344 connected in series between the summation node 325 and a decoder fuse terminal 345, and a switching transistor T3 346 connected between the decoder fuse terminal 345 and ground. The switching transistor receives a repair address RA1 and in response thereto connects the decoder fuse terminal 345 with ground. Similarly, the second decoder fuse portion 350 further comprises decoder fuses $F_{D21}$ 352 and $F_{D22}$ 354 connected in series between the summation node 325 and a decoder fuse terminal 355, and a switching transistor T4 356 connected between the decoder fuse terminal 355 and ground.

In FIG. 3, a fuse means comprises a master fuse portion, with master fuses $F_{M1}$ 302 and $F_{M2}$ 304, first decoding fuse portion of decoding fuses $F_{D11}$ 342 and $F_{D12}$ 344, and second decoding fuse portion of decoding fuses $F_{D21}$ 352 and $F_{D22}$ 354.

In a preferred embodiment, each of the fuses $F_{M1}$ 302, $F_{M2}$ 304, $F_{D11}$ 342, and $F_{D12}$ 344 are polysilicon fuses which may be cut with a laser beam cutting device.

Thus, each fuse portion of the fuse means has a pair of fuses which are coupled in series, serving as a set of fuses. Accordingly, if either of the pair of fuses is completely cut, the purpose of arranging the fuses is successfully realized, resulting in a successful repair of the circuit.

That is, in a case of the redundancy circuit shown in FIG. 3, repair by replacing a main cell with a redundancy circuit can be obtained more efficiently. In such a case, the repair is effective by cutting just one of the fuses included in each of the master fuse portions or in each of the target decoding fuse portions corresponding to the address of a cell.

Thus, performing the repair requires at least a two-step procedure: (1) cutting one of the master fuses $F_{M1}$ and $F_{M2}$ in the master fuse portion and (2) selectively cutting one of decoding fuses $F_{D11}$ and $F_{D12}$ or $F_{D21}$ and $F_{D22}$ of a decoding fuse portions corresponding to the address of an impaired cell.

As a result, a redundancy circuit using the fuse constructed by the method according to the present invention can increase reliability of the circuit and ease of repairs, compared with circuits using a conventional method. In effect, a perfect cut of any of the two or more fuses in a fuse portion is a successful repair, which results in normal operation of a redundancy decoder.

The fuse construction method of the present invention allows the fuse to be used for adjusting transistor dimensions, obtaining the transmission delay of a signal, and controlling the pulse-width of a signal as well as for constructing a redundancy decoder as shown above. While it might seem logically better to provide more than two fuses which are connected in a series, a set of two fuses per fuse portion is preferable because of limitations to the amount of space available in the area occupied by the arrangement of fuses.

As described above, according to the present invention, the probability of accurately repairing, by cutting at least one fuse of the fuse means portion, is increased, thereby in turn increasing the operational reliability of a semiconductor circuit. By providing a fuse means including a plurality of fuses connected in series, an accurate cutting of any one of the fuses of one of the fuse portions of the fuse means is effective to repair the circuit, even if in cutting one of the fuses a cut is done imperfectly.

It should be understood that the invention is not limited to the illustrated embodiment and that many changes and modifications can be made within the scope of the present invention by a skilled person in the art.

What is claimed is:

1. A semiconductor devices comprising:
    a precharge control circuit that provides a precharge control node voltage at a precharge control node;
    a precharging circuit connected between a supply voltage and a summation node and controlled by the precharge control node voltage; and
    a programming circuit connected between the summation node and ground,
    said precharge control circuit comprising a master fuse portion including a plurality of master fuses connected in series between the supply voltage and the precharge control node, and a high-resistance load connected between the precharge control node and ground.

2. The semiconductor device of claim 1, wherein said master fuse portion comprises two fuses connected in series.

3. The semiconductor device of claim 1, wherein at least one of said plurality of master fuses is a polysilicon fuse that can be cut by a laser beam device.

4. The semiconductor device of claim 1, wherein each of said plurality of master fuses is a polysilicon fuse that can be cut by a laser beam device and wherein a second of said plurality of master fuses is cut if a first of said plurality of master fuses that is cut does not result in an open circuit.

5. A semiconductor device comprising:
a precharge control circuit that provides a precharge control node voltage;
a precharging circuit connected between a supply voltage and a summation node and controlled by the precharge control node voltage; and
a programming circuit connected between the summation node and ground,
said programming circuit comprising a decoder fuse portion including a plurality of decoder fuses connected in series between the summation node and a decoder fuse terminal, and a switching transistor that receives a repair address and in response thereto couples the decoder fuse terminal to ground.

6. The semiconductor device of claim 5, wherein said decoder fuse portion comprises two decoder fuses connected in series.

7. The semiconductor device of claim 5, wherein at least one of said plurality of decoder fuses is a polysilicon fuse that can be cut by a laser beam device.

8. The semiconductor device of claim 5, wherein said programming circuit further comprises a second decoder fuse portion including a second plurality of decoder fuses connected in series between the summation node and a second decoder fuse terminal, and a second switching transistor that receives a second repair address and in response thereto couples the second decoder fuse terminal to ground.

9. The semiconductor device of claim 5, wherein said precharge control circuit provides the precharge control node voltage to a precharge control node and further comprises a master fuse portion including a plurality of master fuses connected in series between the supply voltage and the precharge control node, and a high-resistance load connected between the precharge control node and ground.

10. The semiconductor device of claim 5, wherein each of said plurality of decoder fuses is a polysilicon fuse that can be cut by a laser beam device and wherein a second of said plurality of decoder fuses is cut if a first of said plurality of decoder fuses that is cut does not result in an open circuit.

11. A method of providing a fuse apparatus comprising a master fuse portion and a decoder fuse portion in a semiconductor device, comprising:
connecting a precharging circuit between a supply voltage and a summation node;
connecting the master fuse portion between the supply voltage and a precharge control node, the precharging circuit being disabled when a precharge control node voltage at the precharge control node is pulled up to the supply voltage by the master fuse portion;
connecting a high-load resistance between the precharge control node and ground for pulling the precharge control node voltage to ground when the master fuse portion is cut; and
connecting a programming circuit comprising the decoder fuse portion between the summation node and ground,
the master fuse portion comprising a plurality of master fuses connected in series.

12. The method of claim 11, wherein the master fuse portion comprises two master fuses connected in series.

13. The method of claim 12, wherein the decoder fuse portion comprises a plurality of decoder fuses connected in series.

14. The method of claim 11, wherein each of said plurality of master fuses is a polysilicon fuse that can be cut by a laser beam device and wherein a second of said plurality of master fuses is cut if a first of said plurality of master fuses that is cut does not result in an open circuit.

15. A method of providing a fuse apparatus comprising a master fuse portion and a decoder fuse portion in a semiconductor device, comprising:
providing a precharging control circuit comprising the master fuse portion, to output a precharge control node voltage;
connecting a precharging circuit, controlled by the precharge control node voltage, between a supply voltage and a summation node; and
connecting a programming circuit between the summation node and ground, the programming circuit comprising a decoder fuse portion including a plurality of decoder fuses connected in series between the summation node and a decoder fuse terminal, and a switching transistor that receives a repair address and in response thereto couples the decoder fuse terminal to ground.

16. The method of claim 15, wherein the decoder fuse portion comprises two decoder fuses connected in series.

17. The method of claim 15, wherein the master fuse portion comprises a plurality of master fuses connected in series.

18. The method of claim 15, wherein each of said plurality of decoder fuses is a polysilicon fuse that can be cut by a laser beam device and wherein a second of said plurality of decoder fuses is cut if a first of said plurality of decoder fuses that is cut does not result in an open circuit.

* * * * *